United States Patent
Clavelier et al.

(10) Patent No.: US 8,288,250 B2
(45) Date of Patent: Oct. 16, 2012

(54) METHOD FOR TRANSFERRING CHIPS ONTO A SUBSTRATE

(75) Inventors: Laurent Clavelier, Grenoble (FR); Chrystel Deguet, Saint Ismier (FR); Patrick Leduc, Grenoble (FR); Hubert Moriceau, Saint-Egreve (FR)

(73) Assignee: Commissariat a l'Energie Atomique, Paris (FR)

( * ) Notice: Subject to any disclaimer, the term of this patent is extended or adjusted under 35 U.S.C. 154(b) by 281 days.

(21) Appl. No.: 12/564,597

(22) Filed: Sep. 22, 2009

(65) Prior Publication Data
US 2010/0075461 A1    Mar. 25, 2010

(30) Foreign Application Priority Data
Sep. 24, 2008    (FR) ..................... 08 56421

(51) Int. Cl.
*H01L 21/30*  (2006.01)
*H01L 21/46*  (2006.01)

(52) U.S. Cl. ........ 438/459; 438/107; 438/118; 438/455; 438/458; 438/464; 438/528; 438/977

(58) Field of Classification Search .............. 438/107, 438/118, 455, 458–459, 464, 528, 977
See application file for complete search history.

(56) References Cited

U.S. PATENT DOCUMENTS

| | | | |
|---|---|---|---|
| 6,187,110 B1 | 2/2001 | Henley et al. | |
| 6,313,333 B1 | 11/2001 | Da Re et al. | |
| 6,346,459 B1 * | 2/2002 | Usenko et al. | 438/458 |
| 6,455,398 B1 * | 9/2002 | Fonstad et al. | 438/459 |
| 6,638,835 B2 * | 10/2003 | Roberds et al. | 438/458 |
| 6,727,549 B1 | 4/2004 | Doyle | |
| 6,759,277 B1 | 7/2004 | Flores et al. | |
| 6,891,578 B2 * | 5/2005 | Yonehara et al. | 349/43 |
| 6,955,971 B2 * | 10/2005 | Ghyselen et al. | 438/406 |
| 7,029,950 B2 * | 4/2006 | Yonehara et al. | 438/113 |
| 7,205,211 B2 | 4/2007 | Aspar et al. | |
| 7,615,463 B2 | 11/2009 | Aspar et al. | |
| 2004/0102020 A1 * | 5/2004 | Roberds et al. | 438/455 |
| 2005/0124138 A1 | 6/2005 | Aspar et al. | |
| 2005/0221583 A1 | 10/2005 | Aspar et al. | |

FOREIGN PATENT DOCUMENTS
DE    10223719 C1    11/2003
FR    2758907 A1    7/1998

OTHER PUBLICATIONS

Preliminary French Search Report for Appl. No. FR 0856421 dated May 26, 2009.

(Continued)

*Primary Examiner* — Bac Au
(74) *Attorney, Agent, or Firm* — Pearne & Gordon LLP

(57) ABSTRACT

A method for making a stack of at least two stages of circuits, each stage including a substrate and at least one component and metallic connections formed in or on this substrate, the assembly of a stage to be transferred onto a previous stage including: a) ionic implantation in the substrate of the stage to be transferred through at least part of the components, so as to form a weakened zone, b) formation of metallic connections of the components, c) transfer and assembly of some of this substrate onto the previous stage, and d) a step to thin the transferred part of the substrate by fracture along the weakened zone.

20 Claims, 8 Drawing Sheets

OTHER PUBLICATIONS

Auberton-Herve, A.J.; et al, "Why can Smart-cut change the future of microelectronics?", International Journal of High Speed Electronics and Systems, vol. 10, No. 1, pp. 131-146, 2000.

Gueguen, P.; et al., "Copper Direct Bonding for 3D Integration", Interconnect Technology Conference, IITC 2008, pp. 61-63, Jun. 1-4, 2008, Burlingame, CA, USA.

Lee, B.H.; et al., "A Novel Pattern Transfer Process for Bonded SOI Giga-bit DRAMs", 1996 IEEE International SOI Conference, pp. 114-115, Oct. 1996.

Yun, C.H.; et al., "Fractional Implantation Area Effects on Patterned Ion-cut Silicon Layer Transfer", 1999 IEEE International Soi Conference, pp. 129-130, Oct. 1999.

* cited by examiner

METHOD FOR TRANSFERRING CHIPS ONTO A SUBSTRATE

TECHNICAL FIELD AND PRIOR ART

The invention relates to the field of stacking semiconductor circuits and techniques for making such stacks, and particularly techniques for transferring components or chips made of semiconducting materials onto a wafer.

Circuits are stacked by two types of techniques at the present time, namely techniques for making transfers from wafer-to-wafer and techniques for transferring chips onto boards.

The wafer-to-wafer transfer is technologically simpler, but it is subject to serious limitations:
- chips for boards to be transferred must be the same size, and this creates a very strong constraint on the design, practically making it impossible to purchase boards from different suppliers to assemble them,
- the efficiency of transferred chips quickly makes this technique unacceptable; for example for the case of chips with an efficiency of 85% (mature system), an operation to transfer 5 boards on top of each other will result in a final total efficiency of only 44%.

The technique for transferring chips onto a wafer offers another solution, but it must use increasingly thin chips which creates other problems. The tendency to transfer increasingly thin chips is explained by the desire to:
- facilitate manufacturing of interconnections of Through Silicon Vias ("TSV"),
- increase the density of these vias (for a given shape ratio, if their depth is reduced the diameter will also be reduced, thus reducing their repetition pitch and therefore increasing their density),
- enable alignment through the thinned chip with standard lithography equipment,
- facilitate inter-chip replanarising operations (in this case, this is the step that consists of making a surface plane once again after transferring chips onto a surface).

The thinnest chips that can be treated at the moment are of the order of 50 μm thick. This thickness can be further reduced by using temporary transfer handles; a sacrificial handle is bonded onto the active face of the circuit to be thinned, the role of this handle being to act as a mechanical support for the thinned wafer (it is usually a silicon wafer). Once the passive face of the circuit to be transferred has been thinned, the chips are cut and then bonded. The next step is to remove the piece of the handle that made each chip rigid.

At the moment, there are two techniques for temporarily bonding/disassembling a handle:
- molecular or direct bonding, said to be removable bonding, with mechanical removal of the handle by inserting a separator (for example a blade). Its major disadvantage is due to the fact that the handle of each chip has to be separated individually; for example, if 1×1 cm² chips are transferred at a pitch of 1.5 cm onto a 300 mm diameter wafer, about 310 chips have to be separated individually per wafer, which is unacceptable,
- "resin" type bonding, with disassembly of the temporary handle by heat treatment, often mechanically assisted (shear). The difficulties are both due to the individual mechanical action and management of bonding resin residues.

Furthermore, the grinding technique used to thin boards, which in the best case introduces a thickness variation of +/−1 μm for thinning leading to thinned chip thicknesses of up to 5-10 μm, which is still not sufficient. Such a thickness variation requires super-etching of vias which limits the density and increases the cost, and limits the production and precision of subsequent planarising.

Therefore, the problem that arises is to find a new method by which components can be transferred onto a wafer, particularly in order to stack component stages.

PRESENTATION OF THE INVENTION

Therefore the invention relates to a method for making a stack of at least two stages or levels of circuits, each stage comprising a substrate and at least one component, for example of the transistor type, and metallic connections formed in or on this substrate, the assembly of one of said stages, to be transferred onto a previous stage comprising:

a) ionic implantation in the substrate of said stage to be transferred through a surface of this substrate, said to be the implantation surface and through at least part of the components, so as to form a weakened zone under the components of this substrate, b) then a formation of metallic connections of said components in this substrate between each other and/or in order to connect these components to other components, particularly one or more components in the previous stage, c) then assemble some or part of this substrate, comprising components or groups of components, through its implantation surface onto the previous stage, d) then a heat treatment step to thin the transferred part of said substrate by fracture at the weakened zone.

An implantation (step a) before making the metallic connections (step b) avoids the screen effect that the connections would form and also to achieve a sufficient implantation depth. It can assure a subsequent fracture by minimising the thermal budget to be applied to obtain this fracture.

According to the invention, some of the components, in the substrate of the stage or level to be transferred, are formed before the implantation step, while metallic connections in the same substrate are produced after this implantation step. Finally, this implanted substrate comprising components is transferred onto the previous stage, followed by thinning.

Implantation may be done uniformly throughout the substrate, or it may be masked. For example, it may be done to a depth of between 1.5 μm and 2.5 μm under the surface of the substrate of the stage to be transferred.

Step c) may be preceded by a substrate cutting step to individualise the part of this substrate to be transferred and assembled.

Step b) may comprise the production of a series of metallic levels, for example 7 levels, production of each of these metallic levels using a thermal budget with a temperature of about 400° C. for a duration of about 10 to 12 minutes (namely a total budget for 7 metallic levels equal to about 400° C. for 1 h 30 min), the thermal budget for the fracture in step d) being a temperature of about 450° C. for a duration of about 2 h 00. This is the case particularly for a silicon substrate and for some hydrogen implantation conditions, within a range of a few $10^{16}$ to a few $10^{17}$ ions/cm² and advantageously between $5\times10^{16}$ and $10^{17}$ ions/cm² and preferably between $7\times10^{16}$ ions/cm² and $9\times10^{16}$ ions/cm²).

The thermal budget for step b) can increase the weakening induced by implantation, corresponding to about 85% or 90% of the total thermal budget necessary to obtain the fracture along the weakened zone.

Step c) may include bonding between two $SiO_2/SiO_2$ or oxide/oxide dielectric layers, or local metal-metal bonding (metal is not present over the entire surface, and is usually only present at the connection pads).

The component(s) in the stage to be transferred and possibly also the component(s) in the previous stage may be one or more transistors, for example CMOS transistors.

The implantation step a) may then be done after planarising a dielectric that covers the substrate, but before lithography of the vias (or plugs) of transistor sources, drains and gates.

The stack to be made may comprise n stages, where $n \geq 2$; therefore, steps a)-d) may be reiterated until this stack of n stages is obtained. For example, according to one example $5 \leq n \leq 11$, n=7.

In this case, a step to deposit a dielectric on the previous stage and a step to plane this dielectric before reiterating the method could be included (for example directly after step d) or later on).

One or several interconnection levels on the previous stage may also be made before reiterating the method.

DETAILED PRESENTATION OF EMBODIMENTS OF THE INVENTION

Figure 1:
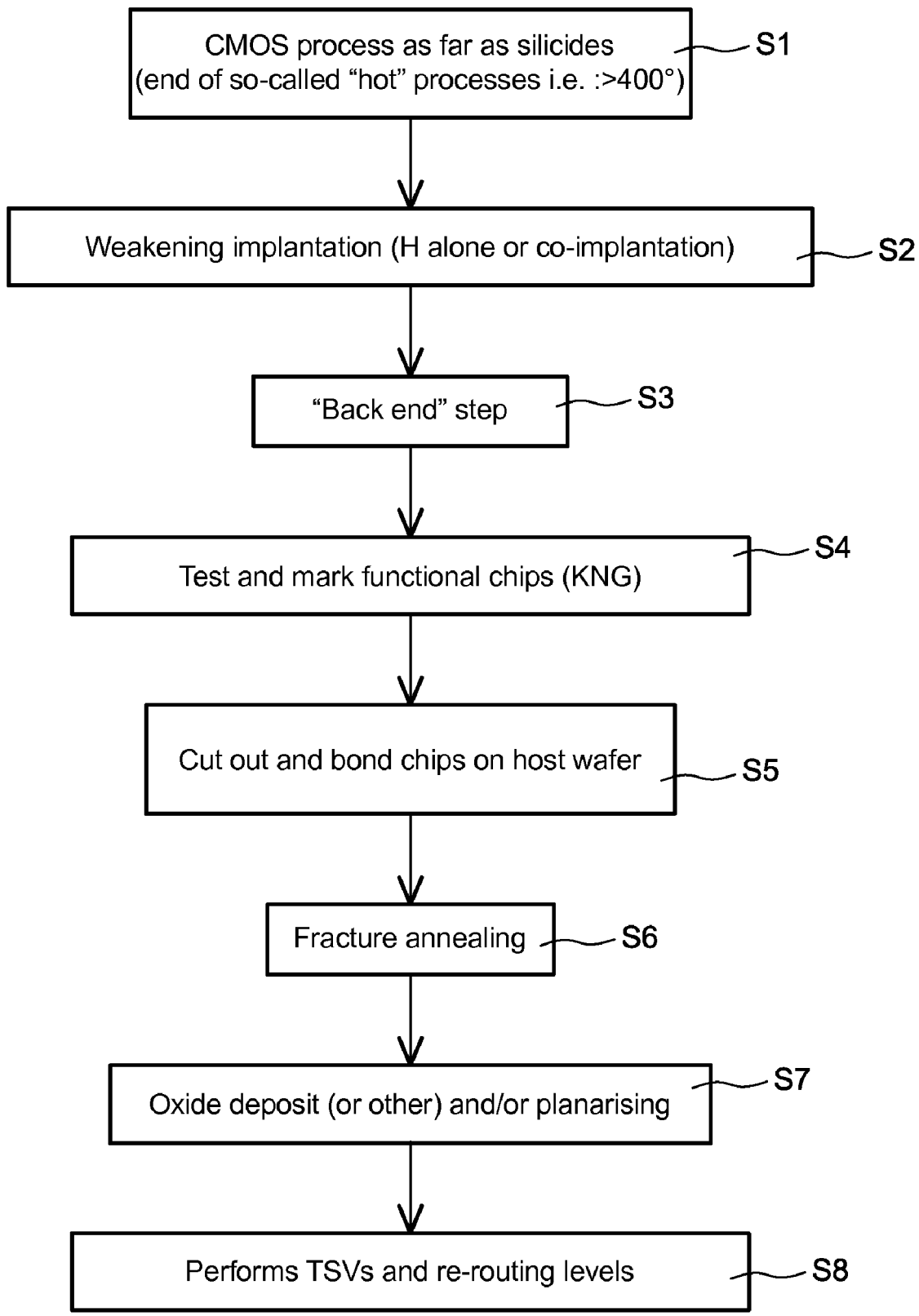
FIG. 1 shows the steps in the method according to the invention.

FIG. 1 shows the steps in a method according to the invention.

Each of these steps is shown in a more detailed manner within the framework of a simple example, the chaining in FIGS. 2A-2H. This example in FIGS. 2A-2H will be described in parallel with FIG. 1 and is deliberately simplified to facilitate understanding.

This description relates to the production of CMOS components.

Figure 2A:
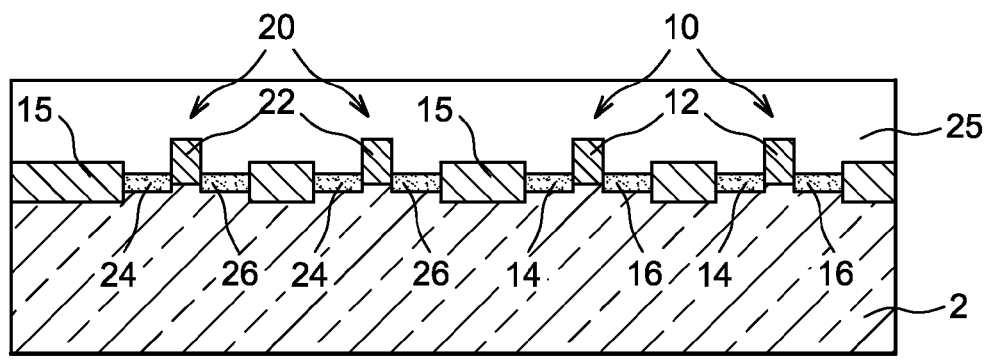
FIGS. 2A-2H show examples of how to carry out steps in a method according to the invention.

In a first step (S1), a plurality of CMOS components 10, 20 each comprising a gate 12, 22, a drain and a source made by doping is made in or on a substrate 2 made of a semiconducting material, for example silicon, and a drain silicide 14, 24 and a source silicide 16, 26 respectively are then formed on top of said drain and said source (FIG. 2A). For example, each of these silicides is made from a Pt, or Pd, or Ni, or Co, or Ti silicide, . . . FIG. 2A also shows transistor isolation oxides 15 (STI oxide). A dielectric 25 (called PMD or "Pre Metal Deposition") is formed and is planarised on this assembly. A CMOS structure of this type is described in more detail in FIGS. 3A, 3B.

In other words, FIG. 2A actually shows a CMOS wafer 2 in which the "hot" steps (carried out at a temperature of more than 400° C.) are terminated after the formation of drain and source silicides and deposition of planarising layers 25. The relief on the wafer is then essentially composed of a set of gates 12, 22, drains 14, 24 and sources 16, 26.

Figure 2B:
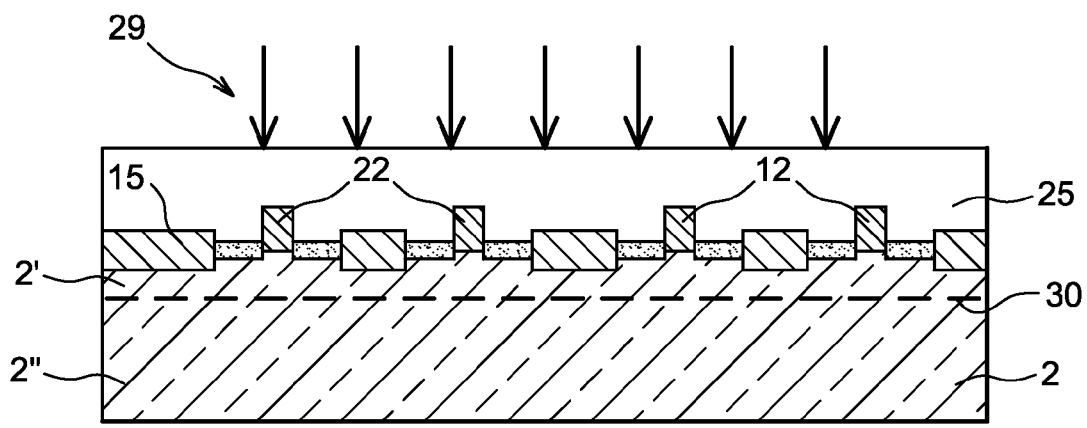

After planarising the dielectric 25, and before lithography of the contact pads of the sources, drains and gates, an implantation of gaseous species 29 for example hydrogen, alone or in co-implantation (step S2) with other species for example such as helium, is made (FIG. 2B). Later on, we will refer to FIGS. 3A-3C to describe how patterns or elements already formed in or on the wafer of the substrate 2 do not form an obstacle to obtaining a uniform implantation in this wafer or this substrate and under the patterns or elements or components 10, 20 already formed. The implantation done defines a weakened zone 30 that can then be used to make a fracture under good conditions.

For example, for an implantation in a silicon substrate, it is possible to choose to implant hydrogen at a dose of between $10^{16}$ or a few $10^{16}$ ions/cm², and $10^{17}$ or a few $10^{17}$ ions/cm², for example $5 \times 10^{16}$ ions/cm² and advantageously between $5 \times 10^{16}$ ions/cm² and $10^{17}$ ions/cm² and preferably between $7 \times 10^{16}$ ions/cm² and $9 \times 10^{16}$ ions/cm². The implantation energy would typically be less than 300 keV, for example between 30 and 200 keV.

The result of this implantation or co-implantation is shown in FIG. 2B by the formation of a weakened zone 30. This zone is continuous in the sense that it extends over the entire wafer, the implantation having been done uniformly over the entire wafer. This zone separates the substrate into two parts, a part 2" under the weakened zone 30, and a part 2' between this weakened zone 30 and the components 10, 20 . . . .

Figure 2C:
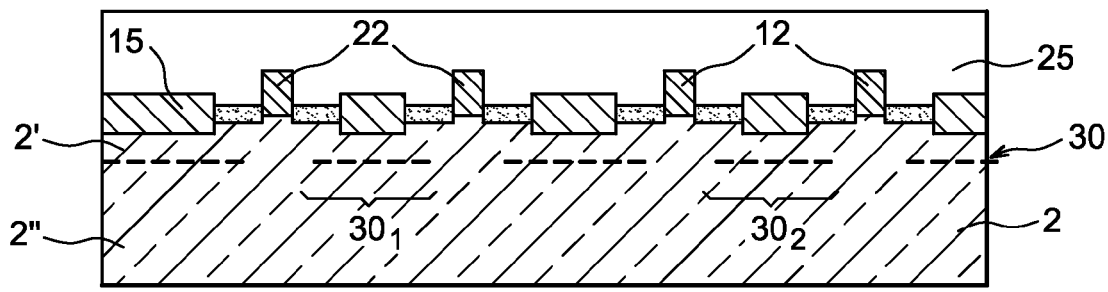

As a variant, it is possible to make a masking level to protect zones that would be sensitive to hydrogen implantation, for example to protect the gates 12, 22 of the MOSFET transistors. The technique described in document FR 2 758 907 could then be used. The result of this implantation or co-implantation is illustrated in FIG. 2C, on which discontinuous weakened zones 30 are obtained, however the distance between two adjacent weakened zones $30_1$, $30_2$ does not reduce the quality of the fracture made later.

During the next step (step S3), "back end" steps of a method are done at low temperature, for example less than 400° C. in the case of a silicon substrate; the plugs, in other words source, drain and gate contact pads are made. The pads are made for example by lithography and etching and then by deposition of an electrically conducting layer, for example successive depositions of Ti, TiN, W or Ta, TaN, W, leading to a Ti/TiN/ or Ta/TaN/W stack. The next step is to eliminate excess deposited material (for example by chemical mechanical polishing CMP and stopping on the PMD dielectric 25).

Figure 2D:
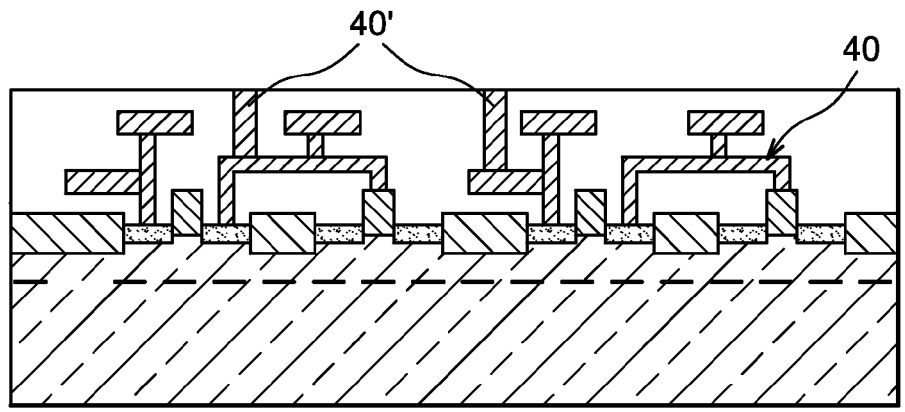

Horizontal tracks (approximately parallel to the xy plane of the substrate) of metal connections 40 (for example Al, or AlCu, or Cu)), are also made above previously formed elements 12, 22, 14, 24, 16, 26 (FIG. 2D). Vias 40' (vertical tracks), are also made approximately along the z axis perpendicular to the xy plane of the substrate. These metallic connections are used to connect components 10, 20 or elements already formed to each other, or later to other components.

The thermal budgets then used are sufficiently limited so that they do not induce a facture into the weakened zone 30, $30_i$, nor a surface deformation that would reduce the quality of a subsequent assembly.

The chips thus made can then be tested and cut out (step S4): only functional chips will be selected for the subsequent assembly step.

Figure 2E:
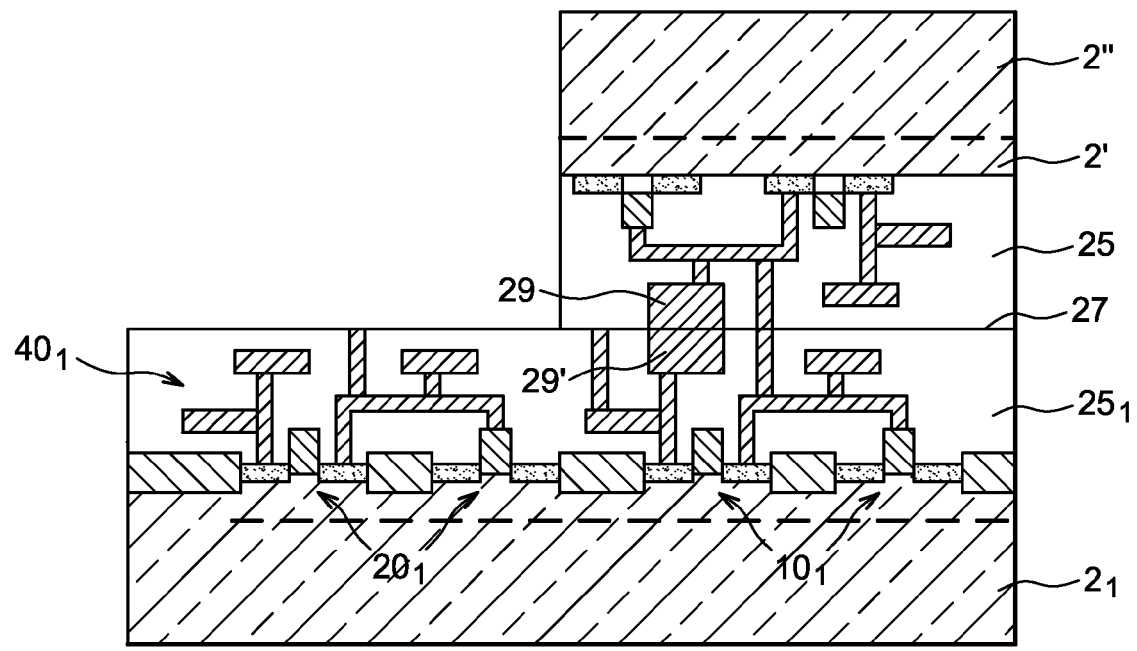

Each selected and cut out chip is then assembled onto a host substrate, for example by bonding (step S5). This host substrate (the previous stacking stage if the method is reiterated) will not be described in detail, but it may also comprise components $10_1$, $20_1$ on a substrate $2_1$, and metallic connections $40_1$ in a dielectric layer $25_1$ (FIG. 2E). The free face 25' of the dielectric 25 will be assembled to the surface of the host substrate, and then more precisely to the dielectric layer $25_1$ of the previous stage if the method is reiterated. In the case shown in FIG. 2E, bonding was done between the two dielectric layers (for example SiO2) for example by molecular bonding between hydrophilic surfaces. To achieve this, the surfaces were previously prepared using one or more of the chemical cleaning, CMP, plasma activation, ozone UV treatment techniques, before they are put into contact. Reference 27 denotes the bonding interface.

As a variant, if the dielectric surfaces 25, $25_1$ are covered by metallic films (for example copper), a metal-metal (copper-copper in the example used) bonding may also be made. The article by P. Gueguen et al entitled "copper direct bonding for 3D integration", ICTC 08 may be referred to for a description of how to make such a bonding. FIG. 2E also shows Cu/Cu type contact zones 29, 29' of the contact pads type (not vias). The contact area of each pad in the xy plane is very much larger than the contact area of a via, which can give a better contact.

One variant will also be to bond different surfaces composed of several materials together (for example oxide and copper materials), or to bond surfaces with topologies.

Any appropriate technique may be used to position chips on the host substrate by, for example so-called "Pick and Place" or self alignment techniques.

Chips may be transferred onto the host substrate chip by chip or by group of chips. FIG. 2E shows a chip that is assembled onto a host substrate, itself resulting from the method according to the invention.

Once the chips have been put into place on the host substrate, a fracture heat treatment step (step S6) is carried out at low temperature that will fracture each chip along the weakened zone. This heat treatment may be assisted by a mechanical strain, for example by inserting a separator or using any other technique that could accelerate the fracture.

This fracture operation will preferably be carried out under the thermal budget conditions described below.

The fracture technique used is known under the term Smart Cut™ and it is described for example in the article by A. J. Auberton-Hervé et al "Why can Smart-Cut change the future of microelectronics?" published in the International Journal of High Speed Electronics and Systems, Vol. 10, No. 1 (2000), p. 131-146.

Figure 2F:
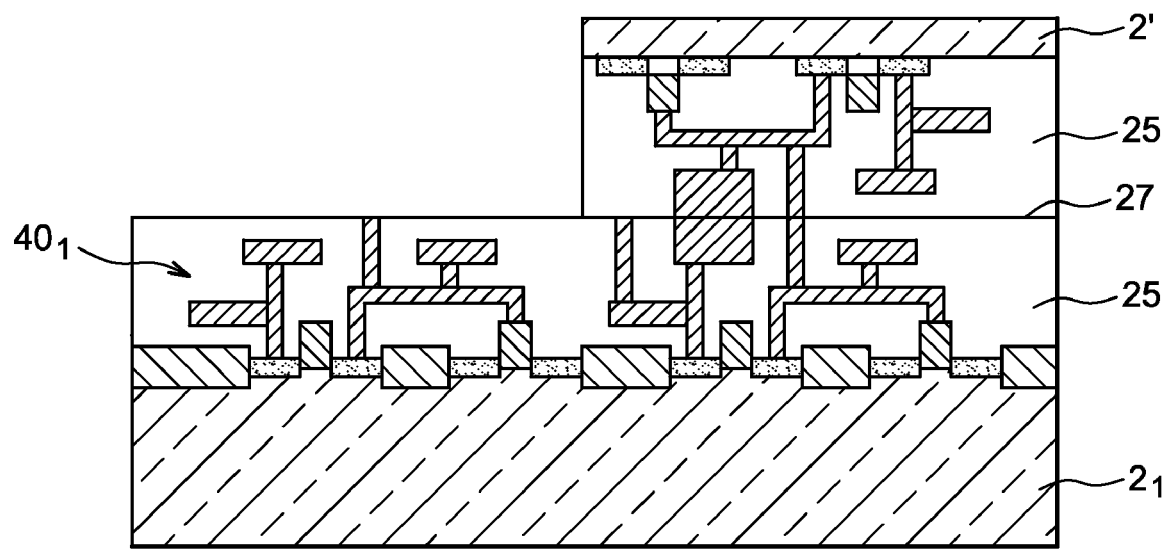
Figure 2G:
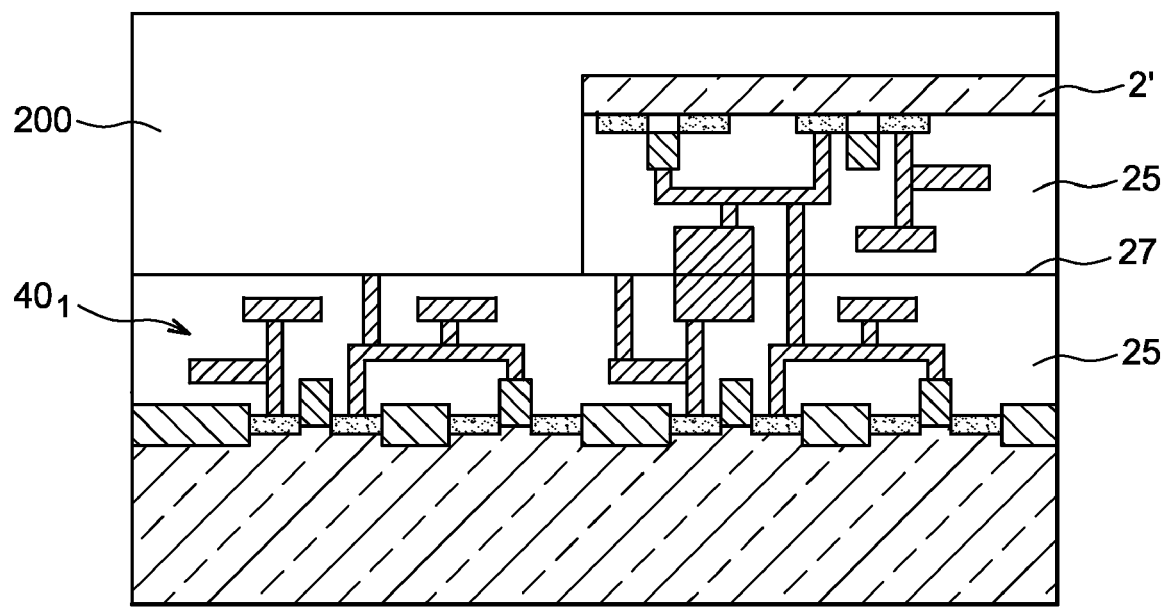

FIG. 2F shows the state of the transferred chip after fracture. Portion 2' of the initial substrate 2 remains fixed to components 10, 20.

We can then (step S7) make a planarising step at the face released by the fracture. A layer 200 can be deposited, for example an oxide (FIG. 2G), and then possibly planarised to form a new surface 200', as a complement or as a variant.

Figure 2H:
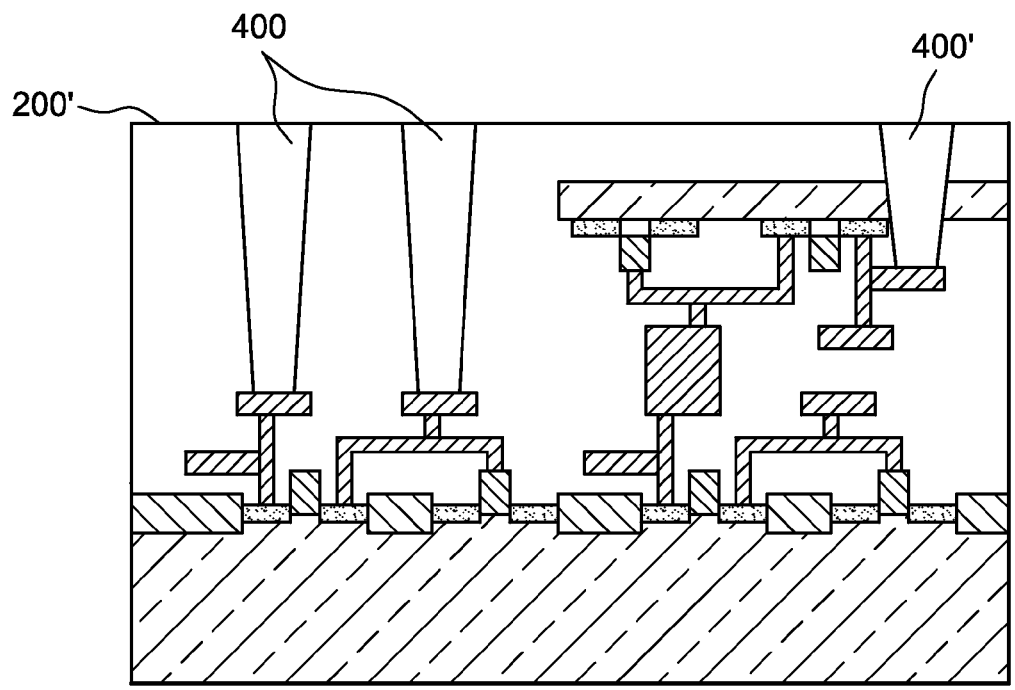

Vias 400, 400' may then be made to establish connections between the surface 200' and components of the host substrate onto which a transfer has just been made, or from the transferred chip or the portion of the transferred substrate (FIG. 2H).

One or several metal levels can also be made, particularly to make complementary or more complex connections.

These steps may be repeated as many time as necessary to obtain the required stacking; for example, the substrate obtained at the end of the previous step (FIG. 2H) may be used and firstly a chip transfer operation is carried out as shown in FIG. 2E followed by other steps in FIG. 2F and subsequent figures, and particularly the fracture in the weakened zone of the substrate of chips currently being transferred.

Figure 3A:
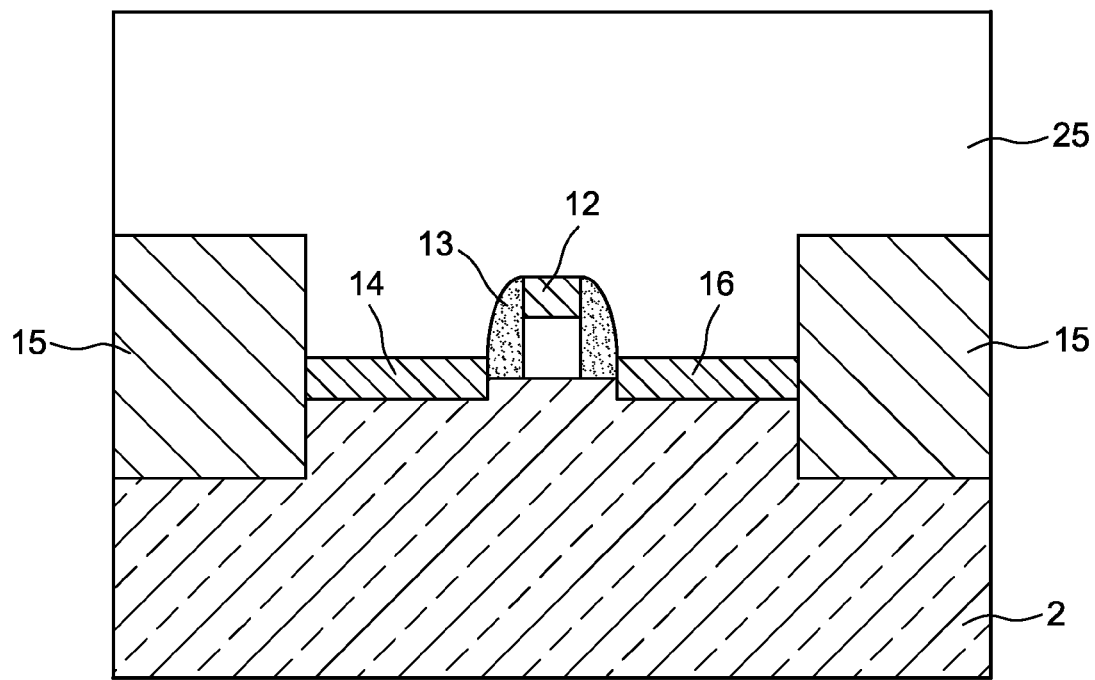
FIGS. 3A-3C show sectional views of a MOSFET transistor before and after implantation.
Figure 3B:
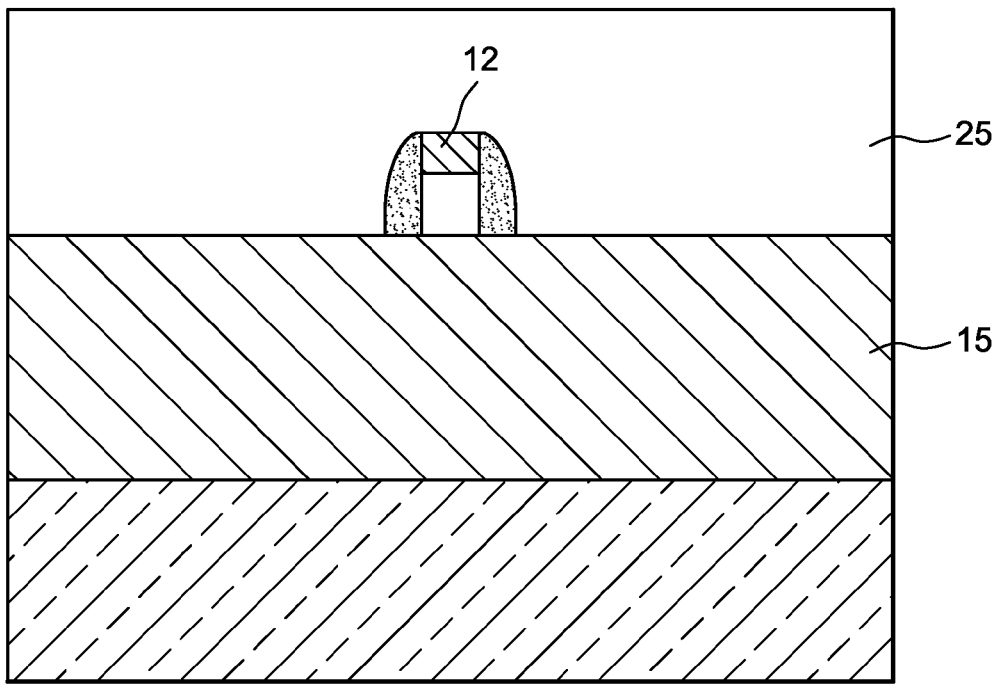

FIGS. 3A and 3B show a MOSFET structure in more detail before the ionic implantation step described above; FIG. 3A is a sectional view in the active zone of the MOSFET, while FIG. 3B is a section at the gate pad. FIG. 3D shows a top view on which the sectional planes PA and PB of FIGS. 3A and 3B are indicated.

The numeric references used in these figures are the same as those already used above. The source 16 and the drain 14 can be seen more precisely. Reference 15 once again denotes the isolation oxide of the transistor (STI oxide). Reference 13 denotes the spacers, for example made of $Si_3N_4$.

Typically, the dielectric layer 25 (PMD), for example made of silicon oxide and/or PSG, is about 400 nm thick, the maximum thickness of the polysilicon gate 12 is about 100 nm, and the maximum thickness of the source and drain silicides is about 20 nm.

The inventors realised that the components do not form a significant screen during the implantation step and the implantation profile is not significantly disturbed despite the lack of homogeneity of zones through which the implantation is done, so that the fracture will not be modified. On the contrary, a finished CMOS circuit with all its metallic levels (5 to 11 at the moment depending on the maturity of the technologies, and typically 7) is not sufficient to make a weakening implantation through the metallic levels compatible with a fracture below the MOSFETs (typically at least 200 nm below the surface). The accumulated thickness of the different metallisation levels is then about several µm, such that implantation ions (in this case hydrogen but the same problem arises for any other element) are stopped before they have reached the silicon in the substrate 2 at a level below the MOSFET level. Therefore, a fracture in the MOSFET is impossible.

The inventors made an atomistic Monte Carlo type simulation known as SRIM, of a very high energy (250 keV) implantation in solid copper (which corresponds to the behaviour of copper in connections of various stacked levels), in order to illustrate the capacity of copper to stop hydrogen implantation; they found a value of Rp (implantation depth or "Range Project") of the order of 2 µm under the copper surface. Thus, if a hydrogen implantation is done on a terminated CMOS wafer in which all metallisation levels are present, namely with an accumulated thickness of several microns, the hydrogen ions are stopped before they have reached the silicon.

Figure 3C:
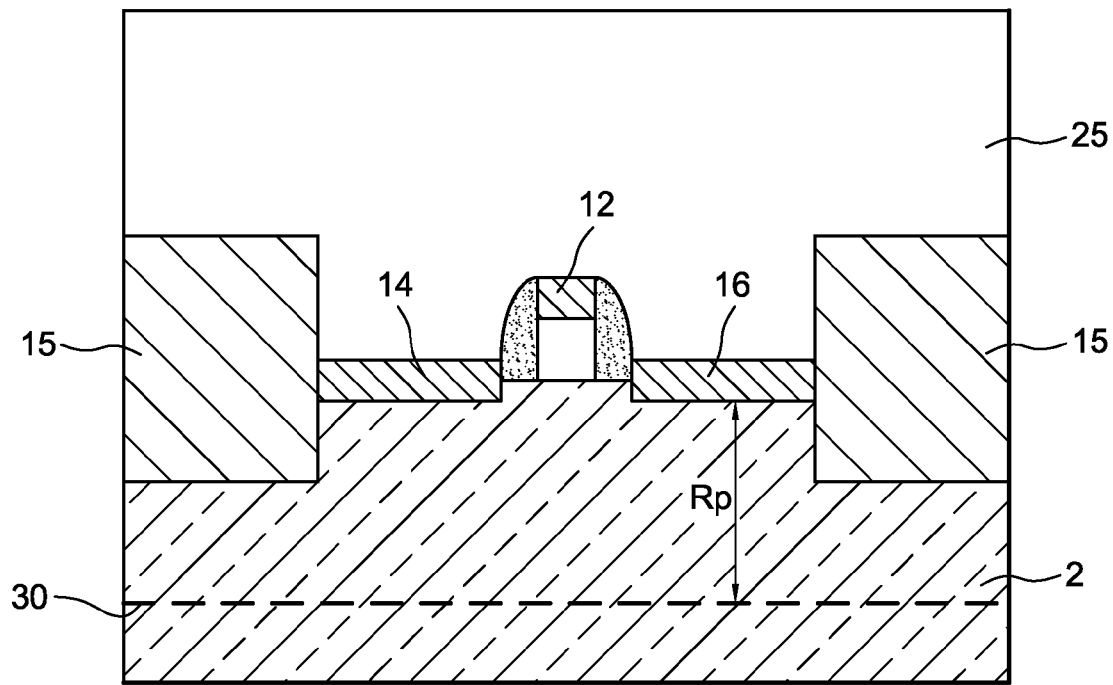
Figure 3D:
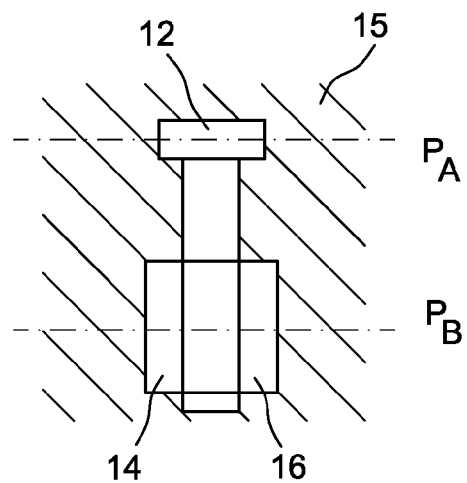
FIG. 3D shows a top view that identifies the positions of sectional planes in FIGS. 3A and 3B, FIGS. 4A and 4B show bubbling and fracture curves in 1/kT, ln(1/t) coordinates.

FIG. 3C shows the same section as FIG. 3A, but after formation of the weakened zone 30. This figure shows that the lack of metal on the trajectory of the ions provides a means of positioning the Rp sufficiently deeply, typically at the depth that can be slightly more than 2 µm under the surface of the substrate 2, and that is proportional to the implantation energy. For example, the implantation may be done at a depth between 1 µm or 1.5 µm and 2.5 µm or 3 µm under the surface of the substrate 2 of the stage to be transferred.

Concerning the total thermal budget used, the inventors have been able to demonstrate that according to the invention it included a first thermal budget (in zone A in FIG. 4A) corresponding to the budget before the bonding step, this budget not inducing any surface deformation incompatible with bonding (this thermal budget is equal to n times the thermal budget of a metal level, where n is the number of metallic levels); a second budget (in zone B in FIG. 4A) corresponding to the budget after which fracture is induced in step S6 respecting the integrity of all structures obtained during previous steps S1 to S5. The temperature of the first budget is equal to approximately 400° C. for a duration of about 1 h 30 mn (for 7 metal levels, which is quite acceptable in the case of 3D stacks of circuits); the temperature for the second budget is equal to approximately 450° C. for a duration of about 2 h 00 (this budget may be adapted as a function of the thermal bonding budget if the thermal bonding budget is not negligible).

This thermal budget range provides a means of making a fracture under conditions acceptable by the materials used with no prior bubbling. It is not strictly limited by the temperature and duration values indicated.

Figure 4A:
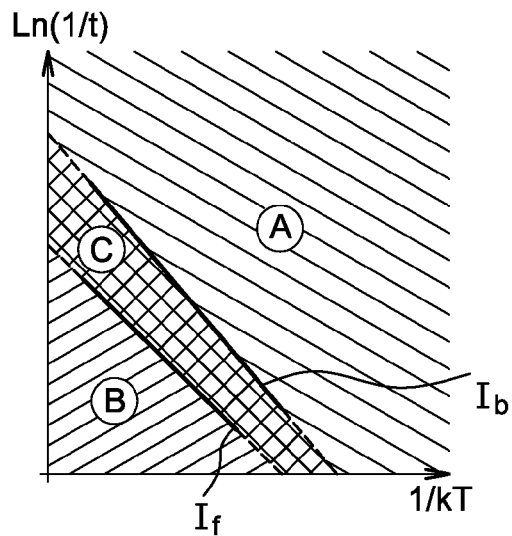
Figure 4B:
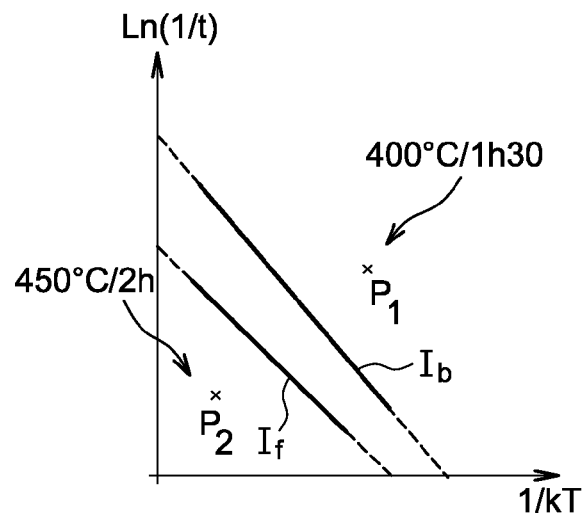

FIGS. 4A and 4B help to understand how the problem that is described is solved.

In these figures, curves $I_b$ and $I_f$ are the bubbling curves and fracture curves respectively for a substrate sample, as shown in FIG. 2C, prepared according to the invention and implanted by gaseous species, for example such as hydrogen. Bubbling (curve Ib) corresponds to an important maturation of microcavities that develop in the zone that was weakened by implantation. The surface deforms in the lack of sufficient stiffening in line with, or above, these cavities, and this deformation can become incompatible with subsequent molecular bonding.

When the stiffener (added by bonding) is sufficiently effective, this mechanism induces fracture (curve If).

Bubbling and/or fracture phenomena are governed by Arrhenius laws of the following type:

$$1/t = A \times \exp(-Ea/kT),$$

where:
t=fracture or bubbling time,
A=pre-exponential term, homogeneous with the inverse of time,
Ea=activation energy in eV,
k: Boltzmann's constant,
T: absolute temperature in K.

$E_a$ and A are parameters of the Arrhenius fracture law, and $E_a'$ and A' are the parameters of Arrhenius bubbling law.

Therefore these two curves are straight lines represented in a coordinate plane (1/kT, ln(1/t)), where t is the duration and T is the absolute temperature in K.

In FIG. 4A, these two straight lines separate the plane in which they are drawn into three zones:
a so-called "non-bubbling" zone A, that corresponds specifically to relatively weak thermal budget conditions, in other words with short durations and lower temperatures than for the other two zones,
a so-called "fracture" zone B that corresponds to relatively high thermal budget conditions, in other words higher temperatures than in the other zones and for fairly long durations,
and an intermediate zone C between the two curves in which the bubbling phenomenon (maturation of cavities) occurs.

Curve Ib becomes closer to curve If as the implantation depth (and therefore the implantation energy) increases.

The thermal budget of the steps preceding bonding (step S5) is located in zone A so as to avoid fracture at the weakened zone and the appearance of a surface deformation incompatible with bonding.

The thermal fracture budget is located in zone B to enable fracture.

An attempt was made to identify the thermal budget of a known production method using the 65 nm technology for a stack comprising up to 7 levels of metallic connections, so as to position the points (T, t) of possible thermal budgets in the context of this invention.

The technological sequence used for each level is approximately as follows, mentioning the thermal budget, temperature and duration for each step:
deposit the dielectric: typically 0.4 μm of SiOC; thermal budget=380° C.-4 min,
annealing to release porogens; thermal budget=400° C.-10 min,
lithography of line/partial etching of the dielectric/resin removal; no thermal budget,
lithography of vias and partial etching of the dielectric, then removal of the resin; no thermal budget,
deposit barrier (typically TaN PVD) and copper; no thermal budget,
anneal the copper; thermal budget=250° C.-2 min,
chemical mechanical polishing of copper; no thermal budget.

By combining all these thermal budgets, it can be estimated that the equivalent thermal budget of a method according to the invention with 7 metal levels is about (400° C., 1 h 30)= $(T_1, t_1)$ (it is about 400° C. for 10 to 12 minutes for each metal level). This thermal budget must not induce any surface deformation incompatible with direct bonding. Point $P_1$ in FIG. 4B corresponds to one possible thermal budget for these steps.

The maximum allowable thermal budget is imposed by the structure itself. In particular, note that a stable nickel silicide is formed at a temperature of about 450° C. This silicide is stable for ½ h at about 550° C. The stability of this silicide is increased to 650° C. for ½ h if fluoride is implanted and a small percent of platinum is added.

Furthermore, the maximum allowable thermal budget for porogens (SiOC type dielectrics) is about (450° C., 2 h).

A maximum thermal budget of (450° C., 2 h) should be respected. Point $P_2$ in FIG. 4B corresponds to such a budget.

The operating point of a method according to the invention preferably satisfies the following criteria (the notations are the same as those already introduced above):
at point $P_1$, $1/t_1 > A' \times \exp(-E_a'/kT_1)$:
cavity maturation condition without inducing bubbling that would be harmful to subsequent bonding, during the formation of metallic connections 40 (FIG. 2D),
at point $P_2$, $1/t_2 < A \times \exp(-E_a/kT_2)$: fracture condition with an allowable thermal budget for metallic connections 40 of the chip and respecting steps S1 to S5.

The temperature and duration conditions $(T_1, t_1)$, $(T_2, t_2)$ mentioned above satisfy these inequalities; thus, FIG. 4B shows that the thermal budget $(T_1, t_1)$ and the thermal budget $(T_2, t_2)$ correspond to chaining of a treatment step without fracture or bubbling that would be incompatible with bonding, and a fracture step.

Figure 5:
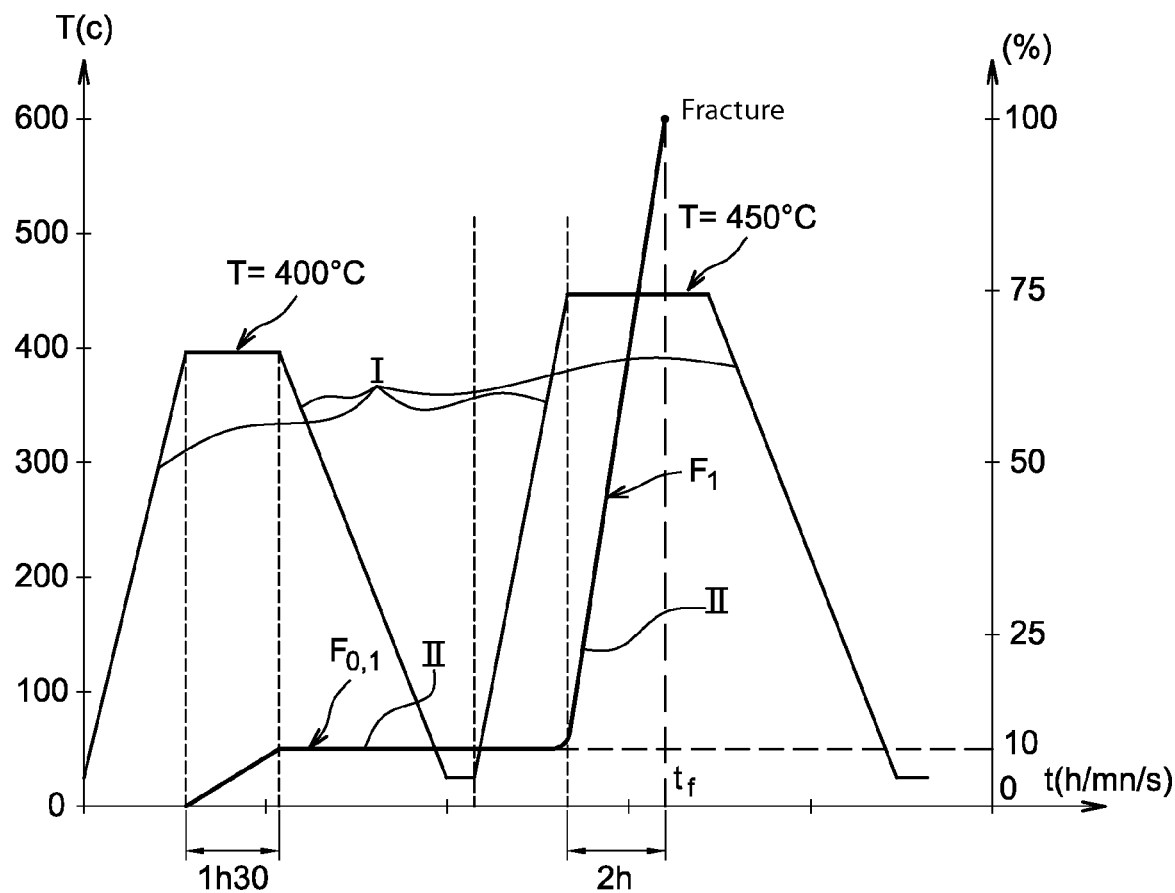
FIG. 5 shows a diagram representing the variation of temperature and a fracture as a function of time for a method according to the invention.

An example embodiment of the invention will be given, this example being illustrated in FIG. 5 showing the temperature variation (curve I, vertical scale at left) as a function of time, and secondly the weakening percentage as a % (curve II, vertical scale at right) also as a function of time.

Starting from a structure like that shown in FIG. 2A, the first step (FIG. 2B) is hydrogen implantation at an energy of 210 keV, with a dose of $8 \times 10^{16}$ ions/cm$^2$.

Heat treatment of the metallic levels (step in FIG. 2D) is done with thermal budgets equivalent to a thermal budget of 400° C.-1 h 30 min, as shown in FIG. 5. This heat treatment causes weakening of the order of 10% as shown by the horizontal line $F_{0,1}$ in FIG. 5. This thermal budget corresponds to 10% of thermal budget necessary to obtain fracture; for example, 10% of the time that would be necessary at this temperature to obtain the fracture at this temperature if bonding were done in the meantime. Such weakening does not cause bubbling due to the implantation energy (i.e. the depth of the weakened zone 30). Therefore it remains compatible with the method according to the invention and particularly with subsequent direct (molecular) bonding (step in FIG. 2E).

An additional heat treatment after bonding with a thermal budget of the order of (450° C., 1 h 30) induces a fracture. This thermal budget is compatible with the allowable heat treatments for a CMOS structure comprising metallic levels. This second heat treatment causes complete rupture at the weakened zone, as shown by the straight line $F_1$ in FIG. 5, because the weakened point at 100% is reached after 1 h 30 at 450° C.

The temperature is then brought back to its ambient value.

The invention claimed is:

1. Method for making a stack of at least two stages of circuits, each stage comprising a substrate and one or more components and metallic connections formed in or on this substrate, the assembly of a stage to be transferred onto a previous stage comprising:
   a) ionic implantation in the substrate of the stage to be transferred through an implantation surface of this substrate and through at least one part of the one or more components, so as to form a weakened zone under at least part of said at least one component of this substrate,
   b) then formation of metallic connections of said components in this substrate between each other and/or in order to connect said at least one component to other components,
   c) then transfer and assembly of part of this substrate, comprising said one or more components, through its implantation surface onto the previous stage comprising one or more components and metallic connections,
   d) then a step to thin the transferred part of said substrate by fracture along the weakened zone.

2. Method according to claim 1, the implantation being done uniformly throughout the substrate, or being done in a masked manner.

3. Method according to claim 1, step c) being preceded by a substrate cutting step to individualise the part of this substrate to be transferred and assembled.

4. Method according to claim 1, the substrate being made of silicon, the implantation being a hydrogen implantation, within a range of between $10^{16}$ ions/cm$^2$ and $5 \times 10^{17}$ ions/cm$^2$.

5. Method according to claim 4, the implantation being a hydrogen implantation, within a range of between $5 \times 10^{16}$ ions/cm$^2$ and $10^{17}$ ions/cm$^2$.

6. Method according to claim 4, the implantation being a hydrogen implantation within a range of between $7 \times 10^{16}$ ions/cm$^2$ and $9 \times 10^{16}$ ions/cm$^2$.

7. Method according to claim 1, step b) being done with a thermal budget for which the temperature is equal to approximately 400° C. for a duration of about 1 h 30 min, the fracture in step d) being done with a thermal budget for which the temperature is equal to approximately 450° C. for a duration of about 2 h 00.

8. Method according to claim 1, step b) being done at a temperature enabling partial fracture along the weakened zone.

9. Method according to claim 1, step c) comprising bonding between two SiO$^2$/SiO$^2$ or oxide/oxide dielectric layers, or local metal-metal bonding.

10. Method according to claim 1, said at least one component in the stage to be transferred being CMOS transistors, the implantation step a) being done after planarising a dielectric that covers the substrate but before lithography of contact pads of sources, drains and gates of the CMOS transistors.

11. Method according to claim 1, in which the stack to be made comprises n stages, n≧2, and in which steps a)-d) are reiterated until this stack of n stages is obtained.

12. Method according to claim 11, in which a planarising step is carried out before reiterating steps a)-d).

13. Method according to claim 11, in which one or several interconnection levels are made on the previous stage before reiterating steps a)-d).

14. Method for making a stack of at least two stages of circuits, each stage comprising a substrate and one or more components and metallic connections formed in or on this substrate, the assembly of a stage to be transferred onto a previous stage comprising:
   a) ionic implantation in the substrate of the stage to be transferred through an implantation surface of this substrate and through at least one part of the one or more components, so as to form a weakened zone under at least part of said at least one component of this substrate,
   b) then formation of metallic connections of said components in this substrate between each other and/or in order to connect said at least one component to other components, with a thermal budget for which the temperature is equal to approximately 400° C. for a duration of about 1 h 30 min,
   c) then transfer and assembly of part of this substrate, comprising said one or more components, through its implantation surface onto the previous stage comprising one or more components and metallic connections,
   d) then a step to thin the transferred part of said substrate by fracture along the weakened zone, with a thermal budget for which the temperature is equal to approximately 450° C. for a duration of about 2 h 00.

15. Method according to claim 14, the components in the stage to be transferred being CMOS transistors, the implantation step a) being done after planarising a dielectric that covers the substrate but before lithography of the contact pads of the transistor sources, drains and gates.

16. Method for making a stack of at least two stages of circuits, each stage comprising a substrate and one or more components and metallic connections formed in or on this substrate, components in a stage to be transferred comprising CMOS transistors, the assembly of said stage to be transferred onto a previous stage comprising:
   a) planarising a dielectric that covers the substrate of said stage to be transferred;
   b) then ionic implantation in the substrate of the stage to be transferred through an implantation surface of this substrate and through at least one part of the one or more components, so as to form a weakened zone under at least part of said at least one component of this substrate,
   c) then forming contact pads of the CMOS transistor sources, drains and gates;
   d) then formation of metallic connections of said components in this substrate between each other and/or in order to connect said at least one component to other components,
   e) then transfer and assembly of part of this substrate, comprising said one or more components, through its implantation surface onto the previous stage comprising one or more components and metallic connections,
   f) then a step to thin the transferred part of said substrate by fracture along the weakened zone.

17. Method according to claim 16, the implantation being done uniformly throughout the substrate, or being done in a masked manner.

18. Method according to claim 16, the substrate being made of silicon, the implantation being a hydrogen implantation, within a range of between $10^{16}$ ions/cm$^2$ and $5 \times 10^{17}$ ions/cm$^2$.

19. Method according to claim 16, step d) being done at a temperature enabling partial fracture along the weakened zone.

20. Method according to claim 16, step c) comprising bonding between two SiO$^2$/SiO$^2$ or oxide/oxide dielectric layers, or local metal-metal bonding.

* * * * *